(12) United States Patent
Banno

(10) Patent No.: US 8,279,907 B2
(45) Date of Patent: Oct. 2, 2012

(54) SEMICONDUCTOR LASER DEVICE AND METHOD FOR CONTROLLING SEMICONDUCTOR LASER

(75) Inventor: Eiichi Banno, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/948,040

(22) Filed: Nov. 17, 2010

(65) Prior Publication Data
US 2011/0116524 A1 May 19, 2011

(30) Foreign Application Priority Data
Nov. 18, 2009 (JP) ................................ 2009-263341

(51) Int. Cl.
*H01S 5/00* (2006.01)
(52) U.S. Cl. .................... 372/50.11; 372/20; 372/43.01; 372/97
(58) Field of Classification Search .................... 372/96, 372/50.11
See application file for complete search history.

(56) References Cited

U.S. PATENT DOCUMENTS 5,473,625 A * 12/1995 Hansen et al. .................. 372/96
5,581,572 A * 12/1996 Delorme et al. ........... 372/50.11
2005/0018741 A1 * 1/2005 Nomaguchi ..................... 372/96
2007/0036188 A1 * 2/2007 Fujii ........................... 372/50.11
2009/0238224 A1 * 9/2009 Ye et al. .......................... 372/28

FOREIGN PATENT DOCUMENTS
JP 2007-048988 A 2/2007
* cited by examiner

*Primary Examiner* — Patrick Stafford
*Assistant Examiner* — Xinning Niu
(74) *Attorney, Agent, or Firm* — Westerman, Hattori, Daniels & Adrian, LLP

(57) ABSTRACT

A semiconductor laser device includes: a semiconductor laser having a reflector region, a gain region for laser oscillation and a plurality of refraction index controllers, the reflector region having a plurality of segments in which a diffraction region and a space region are coupled to each other, the plurality of segments being separated into a plurality of segment groups having a same optical length, the plurality of refractive index controllers being provided according to each segment group and controlling an equivalent refraction index of each segment group; a wavelength controller controlling an oscillation wavelength of the semiconductor laser by controlling the plurality of the refraction index controllers as at least one of control parameters; and a dither controller inputting a dither signal into only one of the segment groups having the most segments from one of the refractive index controllers according to the segment group.

11 Claims, 8 Drawing Sheets

SEMICONDUCTOR LASER DEVICE AND METHOD FOR CONTROLLING SEMICONDUCTOR LASER

CROSS-REFERENCE TO RELATED APPLICATION

This application is based upon and claims the benefit of priority of the prior Japanese Patent Application No. 2009-263341, filed on Nov. 18, 2009, the entire contents of which are incorporated herein by reference.

BACKGROUND (i) Technical Field

The present invention relates to a semiconductor laser device and a method for controlling a semiconductor laser.

(ii) Related Art

It is known that, in a case where an optical signal having small line width and having high power is input into an optical fiber, SBS (Stimulated Brillouin Scattering) may be occurred when a value based on the line width and the power exceeds a threshold value. Thus, the optical signal may get dramatically degraded. A control technology of placing a given amount of wavelength dispersion on an optical output having a small line width (SBS suppression technology) is developed as a method of suppressing signal degradation caused by the SBS.

On the other hand, a structure, in which a SG-DBR (Sampled Grating Distributed Bragg Reflector) and a SG-DFB laser (Sampled Grating Distributed Feedback laser) are coupled to each other, is known as a wavelength tunable laser of which oscillation wavelength is variable.

Japanese Patent Application Publication No. 2007-048988 discloses a wavelength tunable laser in which a CSG-DBR (Chirped Sampled Grating Distributed Bragg Reflector) is coupled to the SG-DFB laser instead of the SG-DBR for increase in performance.

A wavelength tunable laser having the CSG-DBR as a tuning element uses a vernier-shaped selectable wavelength determined by the CSG-DBR. It is preferable that wavelength selectivity of the CSG-DBR is not broken down, if the SBS suppression technology is adapted to the wavelength tunable laser.

SUMMARY

It is an object of the present invention to provide a semiconductor laser device and a method for controlling a semiconductor laser that maintain a vernier characteristics when the SBS suppression technology is adapted to a semiconductor laser having a CSG-DBR.

According to an aspect of the present invention, there is provided a semiconductor laser device including: a semiconductor laser having a reflector region, a gain region for laser oscillation and a plurality of refraction index controllers, the reflector region having a plurality of segments in which a diffraction region and a space region are coupled to each other, the plurality of segments being separated into a plurality of segment groups having a same optical length, the plurality of refractive index controllers being provided according to each segment group and controlling an equivalent refraction index of each segment group; a wavelength controller controlling an oscillation wavelength of the semiconductor laser by controlling the plurality of the refraction index controllers as at least one of control parameters; and a dither controller inputting a dither signal into only one of the segment groups having the most segments from one of the refractive index controllers according to the segment group.

According to another aspect of the present invention, there is provided a method for controlling a semiconductor laser device including: preparing a dither signal that modulates a wavelength of the semiconductor laser; and inputting the dither signal into only one of a segment groups having the most segments of the semiconductor laser device, the semiconductor laser device having a reflector region, a gain region for laser oscillation and a plurality of refraction index controllers, the reflector region having a plurality of segments in which a diffraction region and a space region are coupled to each other, the plurality of segments being separated into a plurality of segment groups having a same optical length, the plurality of refraction index controllers being provided according to each segment group and controlling an equivalent refraction index of each segment group.

BRIEF DESCRIPTION OF THE DRAWINGS

FIG. 6 illustrates a modulation efficiency with respect to an electrical power provided to a heater 14a;

DETAILED DESCRIPTION

A description will be given of a best mode for carrying the present invention.

First Embodiment

Figure 1A:
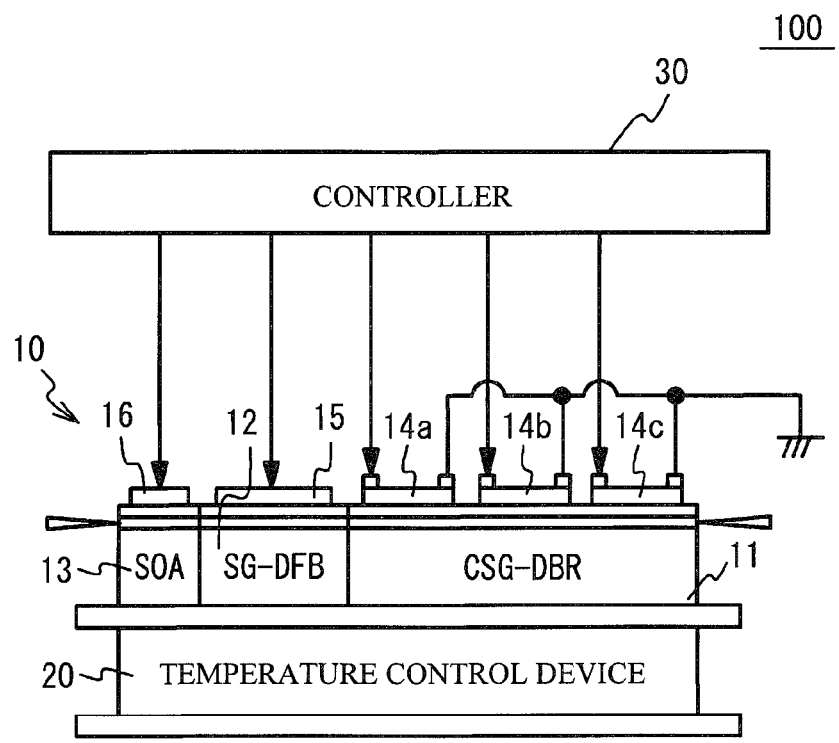
FIGS. 1A and 1B illustrate a semiconductor laser device in accordance with a first embodiment.

FIG. 1A illustrates an overall structure of a semiconductor laser device 100 in accordance with a first embodiment. As illustrated in FIG. 1A, the semiconductor laser device 100 has a semiconductor laser 10, a temperature control device 20 and a controller 30. The semiconductor laser 10 is provided on the temperature control device 20. Next, a description will be given of each part in detail.

The semiconductor laser 10 has a structure in which a CSG-DBR (Chirped Sampled Grating Distributed Bragg Reflector) region 11 acting as one reflector region, a SG-DFB region 12 acting as the other reflector region, and a semiconductor optical amplifier (SOA) region 13 are coupled in order.

The CSG-DBR region 11 includes an optical waveguide in which gratings are formed in a given interval. The optical waveguide of the CSG-DBR region 11 has a plurality of segments in which a space region is coupled to a diffraction region having a diffraction grating. The optical waveguide of the CSG-DBR region 11 is made of semiconductor crystal of which absorption edge wavelength is shorter than a laser oscillation wavelength. In the CSG-DBR region 11, at least two of the segments have a different optical length from each other. Each segment group including segments having the same optical length has a heater.

Figure 1B:
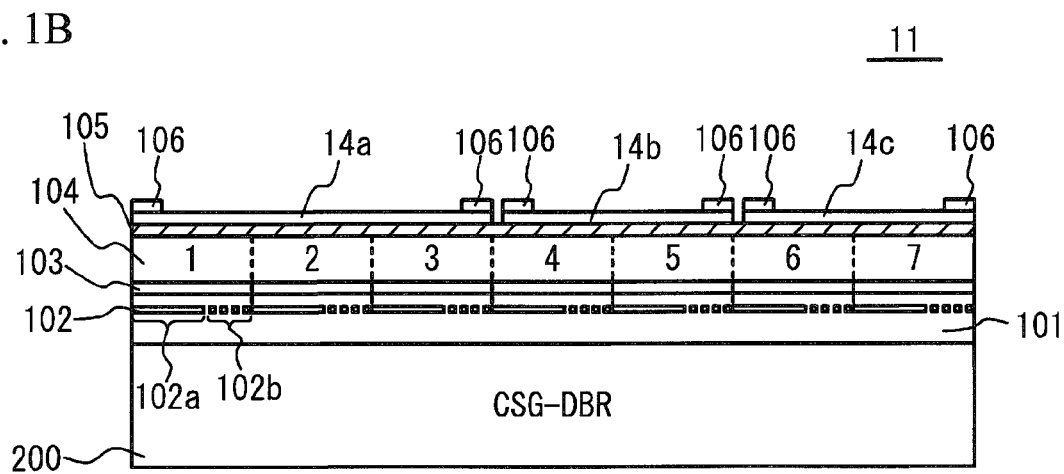

FIG. 1B illustrates details of the CSG-DBR region 11. The CSG-DBR region 11 has a structure in which a lower clad layer 101 made of InP, a grating layer 102 made of InGaAsP, an optical waveguide layer 103 that has a stripe-shaped cross section and is made of InGaAsP, an upper clad layer 104 made of InP, and an insulating layer 105 made of $SiO_2$ are provided on a semiconductor substrate 200 made of InP. The grating layer 102 is implanted in the lower clad layer 101.

The grating layer has a structure in which a space region 102a in which InGaAsP is formed evenly and a diffraction region 102b in which InGaAsP is formed in a given interval are coupled to each other. Heaters 14a, 14b and 14c are provided on the insulating layer 105. An electrode 106 is coupled to both ends of each heater.

It is preferable that thermal consideration is made in order to control a refraction index with the heaters effectively. Both sides of the optical waveguide layer 103 are implanted in an implanting layer. The optical waveguide layer 103 is thermally insulated from other regions when a groove is formed in implanting layers of both sides of the optical waveguide layer 103. This allows improvement of controllability of a refraction index by a heater. A semiconductor layer having low thermal conductivity such as InAlAsP may be provided between the optical waveguide layer 103 and the semiconductor substrate 200. In this case, the heater is controlled effectively.

External heat may be guided into the heaters 14a through 14c directly, if the heaters 14a through 14c are wire-bonded to an external lead provided on a package housing the semiconductor laser 10. It is therefore preferable that a bonding wire is bonded from the lead provided on the package to a pad on the temperature control device 20, and another bonding wire is bonded from the pad to the electrodes of the heaters 14a through 14c. With the structure, direct guidance of external heat into the heaters 14a through 14c is avoided even if external temperature fluctuates, because temperature of an upper face of the temperature control device 20 fluctuates little during the operation of the semiconductor laser 10. The thermal consideration contributes to improvement of modulation responsivity of the heaters 14a through 14c and the SBS suppression control with high accuracy, in the embodiment in which the modulation signal is provided to the heaters.

As illustrated in FIG. 1B, in the embodiment, the CSG-DBR region 11 has seven segments (first segment to seventh segment). The first segment through the third segment have an optical length of L1. The fourth segment and the fifth segment have an optical length of L2. The sixth segment and the seventh segment have an optical length of L3. The L1, L2 and L3 are different from each other.

The first segment through the seventh segment form segment groups classified by the optical lengths L1, L2 and L3. In the embodiment, a first segment group includes the first segment through the third segment. A second segment group includes the fourth segment and the fifth segment. A sixth segment group includes the sixth segment and the seventh segment.

The heater 14a is provided on the first segment through the third segment and extends from the first segment to the third segment. The heater 14b is provided on the fourth segment and the fifth segment and extends from the fourth segment to the fifth segment. The heater 14c is provided on the sixth segment and the seventh segment and extends from the sixth segment to the seventh segment. Therefore, the heater 14a controls a temperature of the first segment through the third segment. The heater 14b controls a temperature of the fourth segment and the fifth segment. The heater 14c controls a temperature of the sixth segment and the seventh segment. In other words, the heater 14a controls an equivalent refraction index of the first segment through the third segment. The heater 14b controls an equivalent refraction index of the fourth segment and the fifth segment. The heater 14c controls an equivalent refraction index of the sixth segment and the seventh segment.

The SG-DFB region 12 includes an optical waveguide in which a grating is formed in a given interval. The optical waveguide of the SG-DFB region 12 has a plurality of segments in which a space region is coupled to a diffraction region having a diffraction grating. Each of the segments of the SG-DFB region 12 has a substantially same optical length. The optical waveguide of the SG-DFB region 12 is made of a semiconductor crystal having a gain with respect to a laser oscillation at a desirable wavelength. An electrode 15 is provided on the SG-DFB region 12.

The SOA region 13 includes an optical waveguide made of a semiconductor crystal providing a gain to a light with a current control or an optical waveguide made of a semiconductor crystal absorbing a light with a current control. An electrode 16 is provided on the SOA region 13. The optical waveguides of the CSG-DBR region 11, the SG-DFB region 12 and the SOA region 13 are optically coupled to each other.

The temperature control device 20 has a peltier element and so on and controls a temperature of the semiconductor laser 10. The controller 30 has a control portion and a source portion. The control portion includes a CPU (Central Processing Unit), a RAM (Random Access Memory) and a ROM (Read Only Memory). The ROM of the controller 30 stores control information of the semiconductor laser 10 and a control program and so on.

Next, a description will be given of an outline operation of the semiconductor laser device 100. The controller 30 provides a given current to the electrode 15. Thereby, the SG-DFB region 12 generates a light in the waveguide. The generated light passes through the optical waveguides of the CSG-DBR region 11, the SG-DFB region 12 and the SOA region 13, is reflected and amplified repeatedly, and is emitted outside. The controller 30 provides a given current to the electrode 16. Thereby, an output of the semiconductor laser 10 is kept constant.

Next, the controller 30 changes the refraction index of the first segment through the seventh segment by controlling the temperature of the first segment through the seventh segment with heaters 14a through 14c. In this case, reflection characteristics of the first segment through the third segment, reflection characteristics of the fourth segment and the fifth segment, and reflection characteristics of the sixth segment and the seventh segment change independently. Therefore, the oscillation wavelength of the semiconductor laser can be changed. With the control process, the semiconductor laser 10 can oscillate at a desirable wavelength in the semiconductor laser device 100.

Figure 2A:
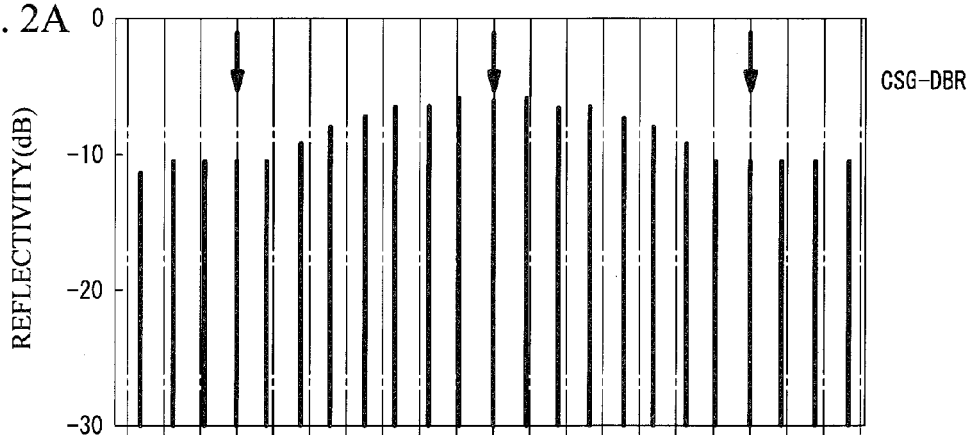
FIG. 2A illustrates a reflection spectrum of an optical waveguide of a CSG-DBR region.
Figure 2B:
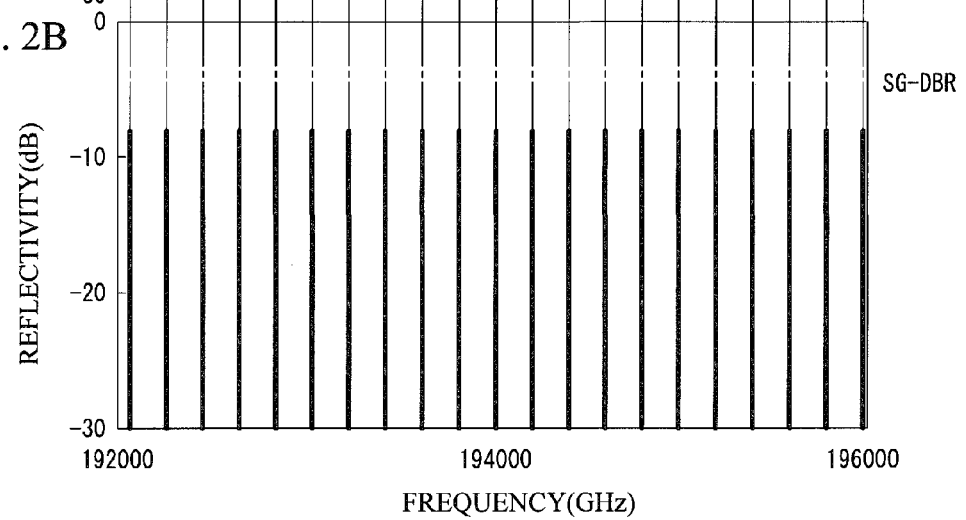
FIG. 2B illustrates a calculation example of a reflection spectrum of an optical waveguide of a SG-DFB region.

FIG. 2A illustrates a calculation example of a reflection spectrum of the optical waveguide of the CSG-DBR region 11. FIG. 2B illustrates a calculation example of a reflection spectrum of the optical waveguide of the SG-DFB region 12. In FIG. 2A and FIG. 2B, a horizontal axis indicates a frequency (wavelength), and a vertical axis indicates reflectivity. In FIG. 2A and FIG. 2B, the calculation example is generalized for simplification. As illustrated in FIG. 2A, the optical waveguide of the CSG-DBR region 11 has relatively high peak reflectivity around a given frequency (wavelength) and a local maximum peak reflectivity. This is because an optical phase of a light passing through each segment of the optical waveguide of the CSG-DBR region 11 back and forth corresponds to integral-multiple of $2\pi$ at the frequency of the local maximum peak reflectivity.

On the other hand, the peak reflectivity is reduced at a frequency (wavelength) away from the local maximum peak reflectivity. This is because an overlapping caused by a phase matching is not occurred when a longitudinal mode interval of each segment is slightly shifted.

The peak reflectivity of the longitudinal mode of the optical waveguide of the CSG-DBR region 11 has a wavelength dependency. On the other hand, the peak reflectivity of the longitudinal mode of the optical waveguide of the SG-DFB region 12 does not have the wavelength dependency. Therefore, the laser oscillation in a wavelength range in which the peak reflectivity of the longitudinal mode of the optical waveguide of the CSG-DBR region 11 is relatively low is restrained, and a stable laser oscillation is obtained in a wavelength range in which the peak reflectivity of the longitudinal mode of the optical waveguide of the CSG-DBR region 11 is relatively high.

The frequency (wavelength) at the local maximum peak reflectivity can be shifted when an average temperature and a temperature gradient (temperature difference between segments) of each segment of the CSG-DBR region 11 is controlled. That is, an oscillation wavelength (channel) can be selected when the average temperature and the temperature gradient of the heaters 14a through 14c are controlled. For example, in the embodiment, the temperature of the heater 14b is the highest, and the temperature of the heater 14c is the lowest. The temperature of the heaters 14a through 14c can be controlled with a driving current of the heaters 14a through 14c.

Next, a description will be given of the SBS suppression technology. A reflection peak wavelength of the SG-DFB region 12 fluctuates when a modulation signal (SBS dither signal) is placed on a driving current of the SG-DFB region 12. In this case, a desirable amount of wavelength dispersion can be set in an optical output having a small line width. However, the gain of the SG-DFB region 12 fluctuates when the driving current of the SG-DFB region 12 fluctuates.

And so, the modulation signal may be placed on the driving signal of the heaters 14a through 14c of the CSG-DBR region 11. For example, vernier characteristics of each segment can be controlled when the modulation signal is placed on the driving current of all heaters. Thus, desirable vernier characteristics of the CSG-DBR region 11 may be obtained by combining the vernier characteristics of each segment.

In this case, the vernier characteristics of the CSG-DBR region 11 can be maintained if the modulation signal placed on the driving current of each heater can be synchronized. However, it is difficult to synchronize the modulation signal of each segment completely. The CSG-DBR region 11 may not maintain the vernier characteristics if the modulation signal of each segment is completely synchronized. The inventor has discovered that a desirable amount of wavelength dispersion can be set in an optical output having a small line width when a modulation signal is input into only one of the heaters.

Figure 3A:
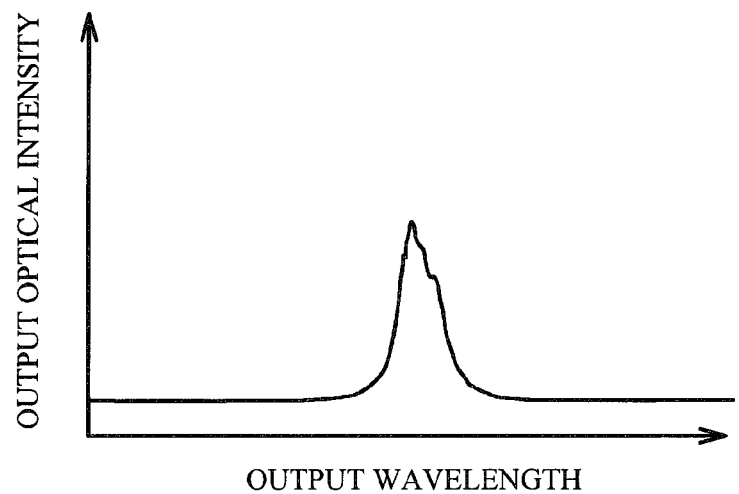
FIGS. 3A and 3B illustrate a line width of an output light of a semiconductor laser.

FIG. 3A illustrates a line width of an output wavelength before a modulation signal (SBS dither modulation signal) is placed on the heater driving current. In the condition, a predetermined driving current is fixedly input to the heaters 14a, 14b and 14c in order to select a desirable wavelength. The segment group of the first segment through the third segment, the segment group of the fourth segment and the fifth segment and the segment group of the sixth segment and the seventh segment are subjected to a refraction index control with the heat generation of the heaters 14a through 14c. Each segment group gets given vernier wavelength characteristics with a given refraction index control value. The CSG-DBR region 11 gets vernier wavelength characteristics when the vernier wavelength characteristics of the segment groups are combined. An oscillation is obtained at a wavelength selected with an overlapping of the vernier wavelength characteristics of the CSG-DBR region 11 and the vernier wavelength characteristics of the SG-DFB region 12. The wavelength is output with a line width illustrated in FIG. 3A.

Figure 3B:
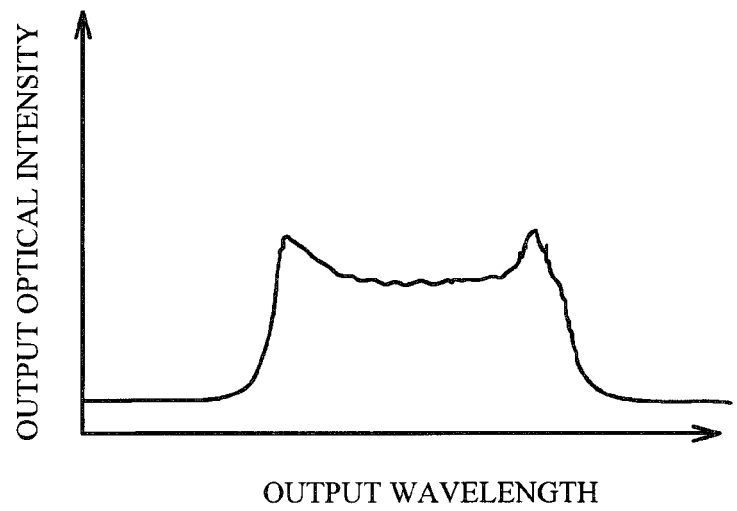

FIG. 3B illustrates a line width of an output wavelength in a case where a modulation signal is placed on a driving current of only one heater in FIG. 1A (heater 14a). As illustrated in FIG. 3B, the line width of a laser output wavelength is enlarged when a modulation signal is input into only one heater.

In this case, a modulation signal is not input to the heaters 14b and 14c. Therefore, the fourth segment through the seventh segment keep a refraction index that is predetermined in order to select a desirable wavelength. Thus, the wavelength tunable laser can keep a normal wavelength selection because a breakdown limit of the vernier wavelength characteristics obtained by the CSG-DBR region 11 is high.

Figure 4:
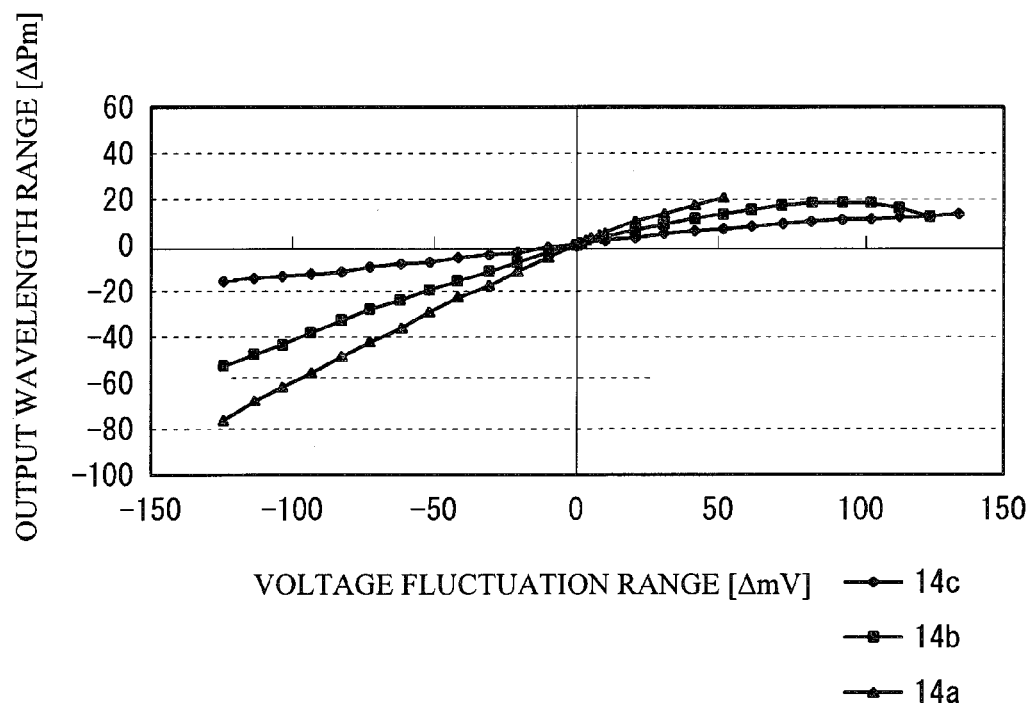
FIG. 4 illustrates a relationship between a heater to which a modulation signal is input and an output wavelength width.

Next, a description will be given of a relationship between the heater to which a modulation signal is input and an enlargement of a wavelength line width. FIG. 4 illustrates the relationship between the heater to which a modulation signal is input and the enlargement of a wavelength line width. In FIG. 4, a horizontal axis indicates a fluctuation width of a voltage applied to each heater, and a vertical axis indicates an output wavelength width (pm) of the semiconductor laser 10. The fluctuation range of the voltage corresponds to amplitude of the modulation signal. In FIG. 4, "14a" indicates a case where the modulation signal is input to only the heater 14a. "14b" indicates a case where the modulation signal is input to only the heater 14b. "14c" indicates a case where the modulation signal is input to only the heater 14c.

As illustrated in FIG. 4, an output wavelength width of 1 GHz (approximately 8 pm) required for the SBS dither is obtained even if a modulation signal is input to any heater. Therefore, the SBS dither effect can be obtained even if a modulation signal is input to any heater. Specifically, in the case where the modulation signal is input to the heater 14a, the wavelength line width is more enlarged with the same modulation amplitude, compared to the cases where the modulation signal is input to the heater 14b or 14c. The effect of line width enlargement of the oscillation wavelength with respect to the modulation amplitude differs according to an absolute value of the driving current of the heater. In the embodiment, the heater 14a receives an average of the driving current of the heaters 14b and 14c. Nevertheless, the effect of the line width enlargement is the most with respect to the heater 14a as illustrated in FIG. 4, because the number of the segment (three) included in the segment group according to the heater 14a is larger than the number of the segment (two) included in the segment group according to the heaters 14b and 14c.

The larger the number of a segment included in a segment group is, the smaller a line width of a selected reflection spectrum is, with respect to each vernier wavelength characteristics of each segment group. In the embodiment, the number of the segment included in the segment group according to the heater 14a is larger than the number of the segment included in the segment group according to the heaters 14b and 14c. Therefore, the reflection spectrum line width of the segment group according to the heater 14a is smaller than that of the other segment groups, with respect to the vernier wavelength characteristics.

The wavelength characteristics of the CSG-DBR region 11 is an overlapping of the wavelength characteristics of each segment group. Therefore, the wavelength characteristics of one segment group (the first segment through the third segment) in which a reflection spectrum line width is smaller than the others contributes to a determination of the wavelength characteristics of a CSG-DBR region more than the wavelength characteristics of the other segment groups (the fourth segment through the fifth segment or the sixth segment through the seventh segment). Thus, a large effect of the line width enlargement is obtained in a case where the heater 14a is modulated with a modulation voltage, compared to a case where the heaters 14b or 14c is modulated with the same modulation voltage.

As mentioned above, a breakdown limit of a vernier wavelength characteristics of the CSG-DBR region 11 gets higher, when a modulation signal is applied to only one of the heaters. In the embodiment, a heater (the heater 14a) according to the segment group including more segments is selected as the only one of the heaters to which the modulation signal is applied.

As apparent from FIG. 4, the modulation amplitude required for a desirable line width enlargement effect is small when the modulation signal is input to the heater 14a. Therefore, the breakdown limit of the vernier wavelength characteristics of the CSG-DBR region 11 is increased more, compared to the cases where the modulation signal is input to the heater 14b or the heater 14c. This allows stable wavelength characteristics of a wavelength tunable laser.

It is preferable that a heater to which the modulation signal is input is other than a heater to which a minimum current is input. There may be a case where no current is input to a heater having the lowest temperature in order to select an oscillation wavelength by controlling the average temperature and the temperature gradient of the heaters 14a to 14c in the semiconductor laser 10. In this case, the modulation signal cannot be input normally. It is therefore preferable that a heater to which the modulation signal is input is other than a heater to which a minimum current is input.

Figure 5:
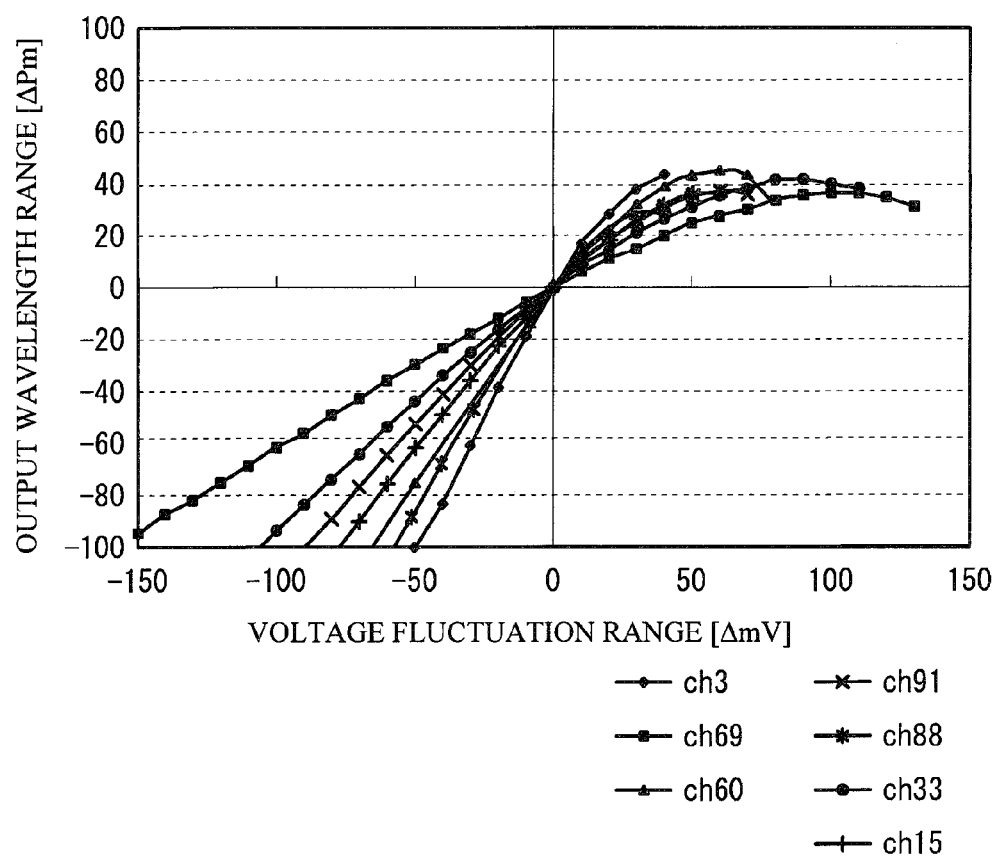
FIG. 5 illustrates a relationship between each channel and the output wavelength width.

Next, a description will be given of a relationship between a channel and the output wavelength range. FIG. 5 illustrates a relationship between each channel and the output wavelength range of the semiconductor laser 10. The channel is a number of output wavelengths from which the semiconductor laser 10 can select. In FIG. 5, a horizontal axis indicates a fluctuation range of a voltage applied to the heater 14a, and a vertical axis indicates the output wavelength range (pm) of the semiconductor laser 10. The fluctuation range of the voltage corresponds to the amplitude of the modulation signal. As illustrated in FIG. 5, the wavelength fluctuation range of each channel is different from each other. Therefore, it has only to change the amplitude of the modulation signal according to the channel. In the embodiment, the modulation signal can be placed with the modulation signal generator 40 included in the controller 30.

The ROM included in the controller 30 may store the amplitude value of the modulation signal of each channel as a table with respect to each channel in a shipping examination.

The table may store not the amplitude value of the modulation signal but a modulation efficiency of each channel in order to change the enlargement of the oscillation line width by a user. It has only to calculate the amplitude value of a required modulation signal from a modulation efficiency of each channel with respect to the line width enlargement given by the user, if the modulation efficiency is stored.

Figure 6:
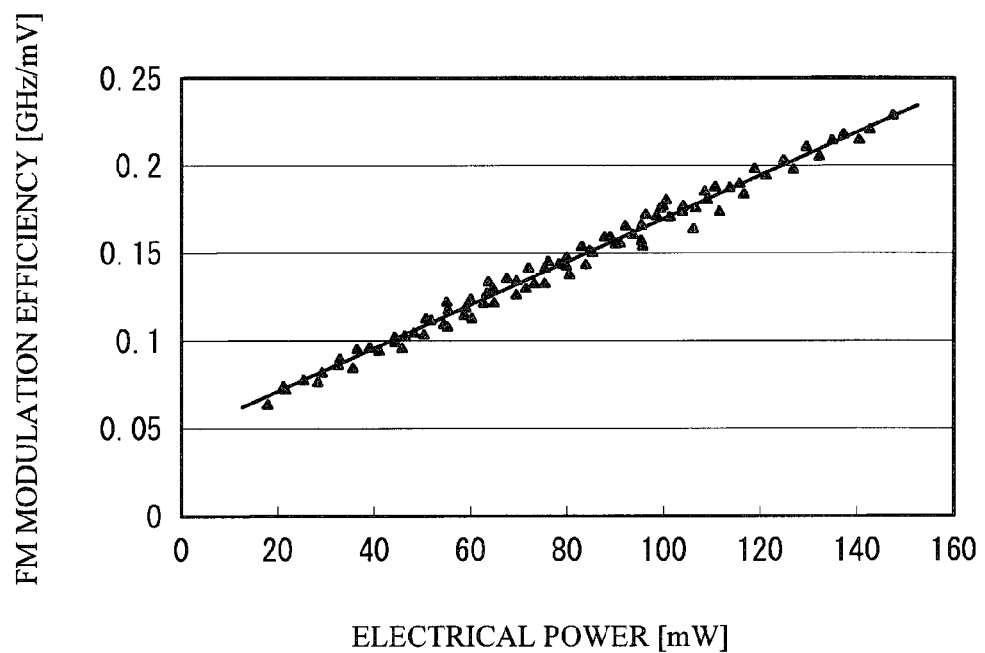

The modulation efficiency has a linear relationship with an electrical power provided to a heater. FIG. 6 illustrates the modulation efficiency of the electrical power provided to the heater 14a. As apparent from FIG. 6, there is a linear correlation between the electrical power provided to the heater 14a and the modulation efficiency. Therefore, the correlation between the electrical power provided to the heater and the modulation efficiency can be specified when a few sample points of the relationship between the modulation efficiency and the electrical power provided to the heaters at the shipping examination are taken.

The modulation efficiency may be obtained based on the electrical power provided to the heater 14a determined by tuning with use of the above-mentioned correlation. Users do not have to measure the modulation amplitude value of each channel if the users calculate the modulation amplitude value to obtain a desirable modulation degree by obtaining the modulation efficiency.

The modulation efficiency can be obtained with respect to each channel when the ROM stores the correlation between the modulation efficiency and the electrical power provided to the heaters as a coefficient or an equation. Thus, amplitude value of a required modulation signal can be calculated with respect to expansion degree of the line width given by the user.

Figure 7:
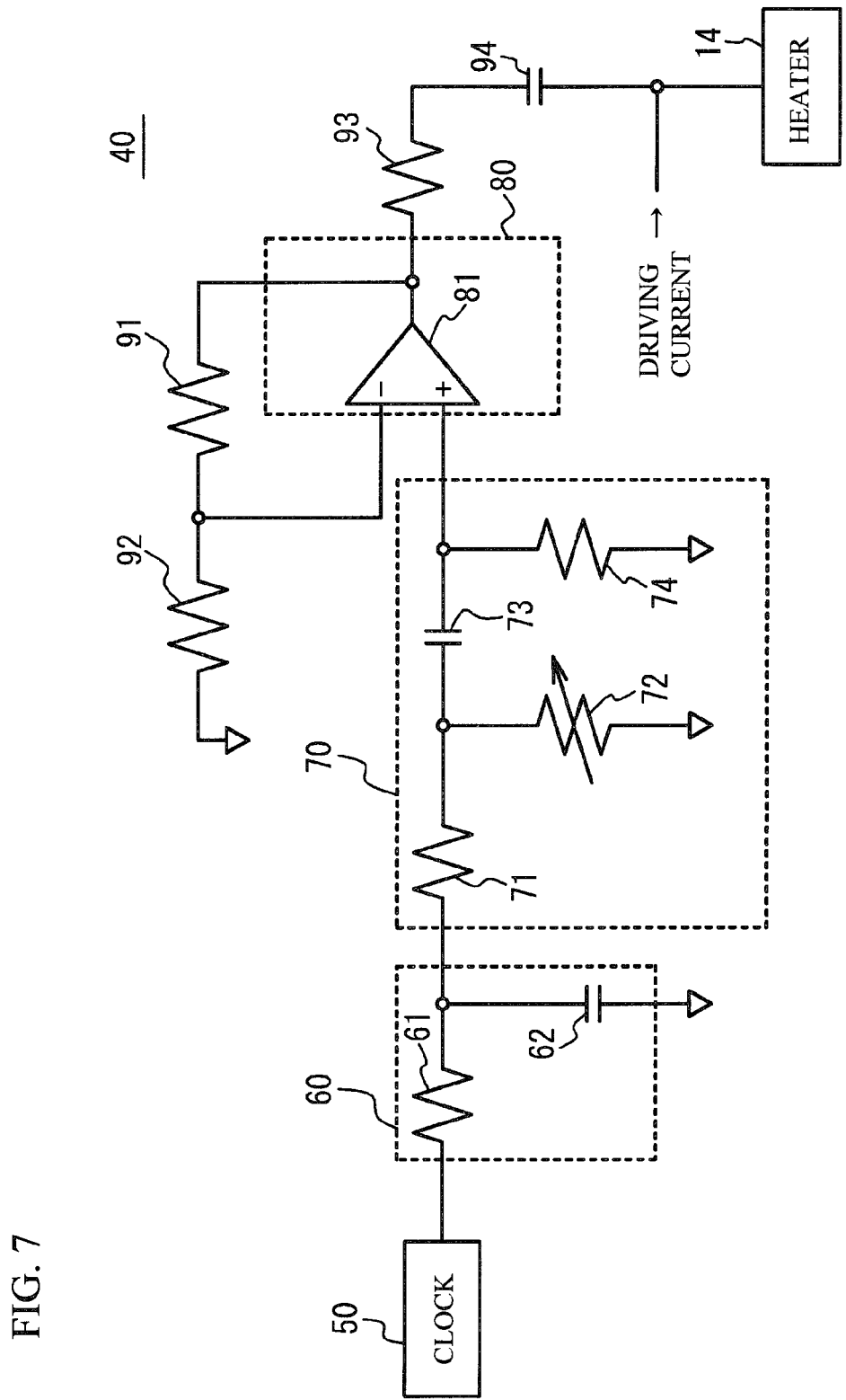
FIG. 7 illustrates a circuit diagram of a modulation signal generator.

FIG. 7 illustrates a circuit diagram of the modulation signal generator 40. As illustrated in FIG. 7, the modulation signal generator 40 includes a clock generator 50, a filter circuit 60, an amplitude adjusting circuit 70 and a buffer circuit 80.

The clock generator 50 generates a square-waveform-shaped modulation signal that is formed by High/Low output of a terminal with use of a timer. The filter circuit 60 includes a resistor 61 and a capacitor 62. The resistor 61 is provided on a wiring extending from the clock generator 50. The capacitor 62 is provided on one branch wiring extending from the resistor 61, and is grounded. The other branch wiring extending from the resistor 61 is coupled to the amplitude adjusting circuit 70. A shape of the modulation signal from the clock generator 50 is softened and is formed into a triangle shape.

The amplitude adjusting circuit 70 includes a resistor 71, a variable resistor 72, a capacitor 73, and a resistor 74. The resistor 71 is provided on a wiring extending from the filter circuit 60. The variable resistor 72 is provided on one branch wiring extending from the resistor 71 and is grounded. The other branch wiring extending from the resistor 71 is coupled to the capacitor 73. The resistor 74 is provided on one branch wiring extending from the capacitor 73 to the buffer circuit 80 and is grounded. The amplitude adjusting circuit 70 adjusts amplitude of a modulation signal provided to the buffer circuit 80 with use of resistive division by adjusting resistance of the variable resistor 72.

The buffer circuit 80 generates an input waveform provided to the heater 14 with use of a modulation signal of which amplitude is adjusted by the amplitude adjusting circuit 70. A resistor 91 and a resistor 92 are used for determination of a gain of the buffer circuit 80.

A resistor 93 and a capacitor 94 are provided in this order on a wiring extending from the buffer circuit 80 to the heater 14. The heater 14 is one of the heaters 14a through 14c. The capacitor 94 removes DC component of the modulation signal. The modulation signal without the DC component is placed on a driving current provided to the heater 14. In this case, the driving current provided to the heater 14 oscillates. Thus, a refraction index of a segment under the heater 14 fluctuates. A resonance wavelength of the semiconductor laser 10 fluctuates according to the fluctuation of the refraction index. Accordingly, the output light of the semiconductor laser 10 gets a given line width (SBS dither suppression effect).

In the embodiment, there are provided a plurality of segments to be heated by each heater. However, the number of the segments heated by each heater is not limited. In the embodiment, the heater 14b has the highest temperature, and the heater 14c has the lowest temperature. However, the high-low relation of temperature is optional. Therefore, the temperature of the heaters may descend from the SG-DFB region 12 side or may increase from the SG-DFB region 12 side. The heaters 14a through 14c may not be aligned in descending order or increasing order.

Second Embodiment

Figure 8:
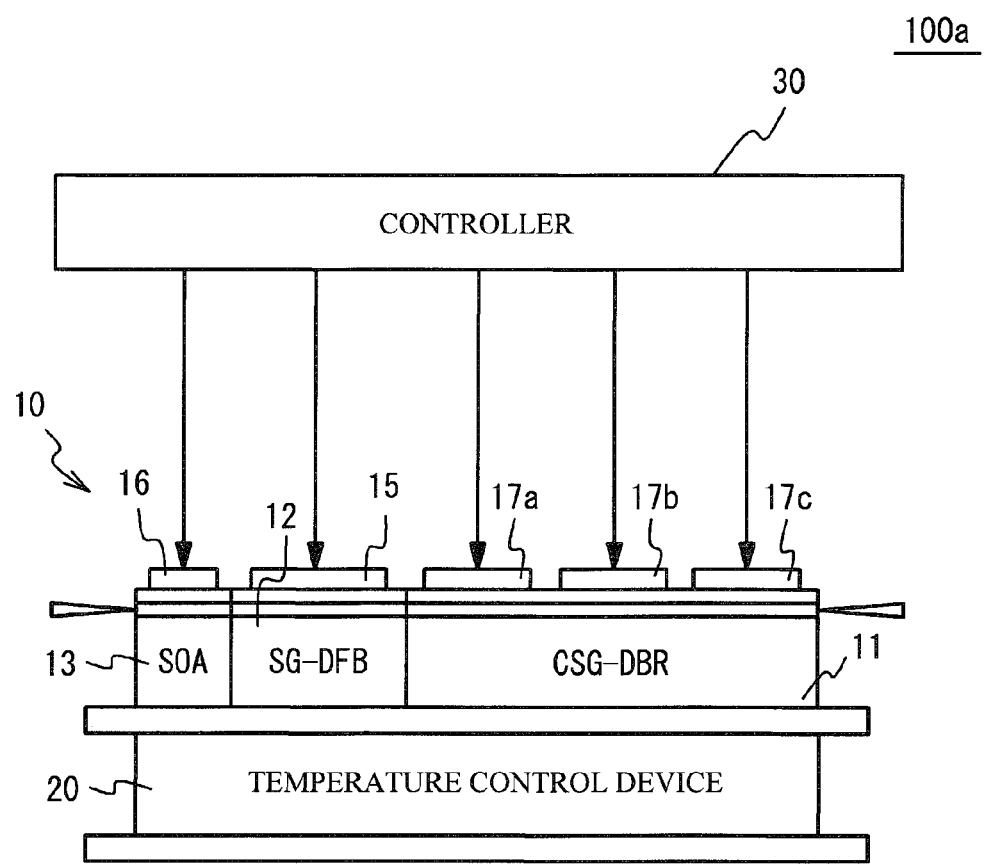
FIG. 8 illustrates an overall structure of a semiconductor laser device in accordance with a second embodiment.

In the first embodiment, the heater is used in order to control the equivalent refraction index of the segment. However, the structure is not limited. A second embodiment is an example in which the equivalent refraction index is controlled with current injection into each segment. FIG. 8 illustrates a schematic view of an overall structure of a semiconductor laser device 100a in accordance with the second embodiment. The semiconductor laser device 100a has electrodes 17a through 17c instead of the heaters 14a through 14c. The electrodes 17a through 17c include a metal layer and an ohmic contact layer and are arranged at the positions of the heaters 14a through 14c.

A current is injected to the first segment through the seventh segment when a current is provided to the electrodes 17a through 17c. Thus, the equivalent refraction index of the first segment through the seventh segment are changed. Therefore, the equivalent refraction index of each segment is controlled when an amount of current provided to the electrodes 17a through 17c, as well as the first embodiment.

The present invention is not limited to the specifically disclosed embodiments and variations but may include other embodiments and variations without departing from the scope of the present invention.

What is claimed is:

1. A semiconductor laser device comprising:
   a semiconductor laser having a reflector region, a gain region for laser oscillation and a plurality of refraction index controllers,
   the reflector region having a plurality of segments in which a diffraction grating region and a space region are coupled to each other,
   the plurality of segments being separated into a plurality of segment groups, the segments in each segment group having a same optical length,
   the plurality of refraction index controllers being provided according to each segment group and controlling an equivalent refraction index of each segment group;
   a wavelength controller controlling an oscillation wavelength of the semiconductor laser by controlling the plurality of the refraction index controllers as at least one of control parameters; and
   a dither controller inputting a dither signal into only one of the segment groups having more segments than any other segment group from one of the refraction index controllers according to the segment group.

2. The semiconductor laser device as claimed in claim 1, wherein the refraction index controller is a heater to control temperature of the segment groups.

3. The semiconductor laser device as claimed in claim 2, wherein one of the refraction index controllers other than a refraction index controller controlling a lowest temperature controls the refraction index of the segment group into which the dither signal is input.

4. The semiconductor laser device as claimed in claim 1, wherein the refraction index controller controls the refraction index by injecting current into the segment group.

5. The semiconductor laser device as claimed in claim 2, wherein the dither signal is supplied to the refraction index controller via a resistor and a capacitor.

6. The semiconductor laser device as claimed in claim 1, wherein the semiconductor laser device is a wavelength tunable laser.

7. The semiconductor laser device as claimed in claim 6, wherein the reflector region is comprised of a CSG-DBR (chirped sampled grating distributed bragg reflector).

8. The semiconductor laser device as claimed in claim 1, wherein the gain region has a SG-DFB (sampled grating distributed feedback reflector).

9. The semiconductor laser device as claimed in claim 8, further comprising a SOA (semiconductor optical amplifier) that is optically connected with the SG-DBR.

10. The semiconductor laser device as claimed in claim 9, further comprising a temperature control device that controls a temperature of the semiconductor laser device.

11. A method for controlling a semiconductor laser device comprising: preparing a dither signal that modulates a wavelength of the semiconductor laser; and inputting the dither signal into only one of a segment groups having more segments than any other segment group of the semiconductor laser device, the semiconductor laser device having a reflector region, a gain region for laser oscillation and a plurality of refraction index controllers, the reflector region having a plurality of segments in which a diffraction grating region and a space region are coupled to each other, the plurality of segments being separated into a plurality of segment groups, the segments in each segment group having a same optical length, the plurality of refraction index controllers being provided according to each segment group and controlling an equivalent refraction index of each segment group.

* * * * *